(12) United States Patent
Gruber et al.

(10) Patent No.: US 8,492,262 B2
(45) Date of Patent: Jul. 23, 2013

(54) DIRECT IMS (INJECTION MOLDED SOLDER) WITHOUT A MASK FOR FORMING SOLDER BUMPS ON SUBSTRATES

(75) Inventors: Peter A. Gruber, Mohegan Lake, NY (US); Paul A. Lauro, Brewster, NY (US); Jae-Woong Nah, Closter, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/706,212

(22) Filed: Feb. 16, 2010

(65) Prior Publication Data

US 2011/0201194 A1   Aug. 18, 2011

(51) Int. Cl.
*H01L 21/44* (2006.01)

(52) U.S. Cl.
USPC ........................................................ 438/613

(58) Field of Classification Search
USPC .................................. 438/613; 257/E21.508
See application file for complete search history.

(56) References Cited

U.S. PATENT DOCUMENTS

| | | | | |
|---|---|---|---|---|
| 5,244,143 A | * | 9/1993 | Ference et al. | 228/180.21 |
| 5,268,072 A | * | 12/1993 | Agarwala et al. | 216/13 |
| 5,388,327 A | * | 2/1995 | Trabucco | 29/830 |
| 5,478,700 A | * | 12/1995 | Gaynes et al. | 430/315 |
| 5,673,846 A | * | 10/1997 | Gruber | 228/180.22 |
| 5,872,051 A | * | 2/1999 | Fallon et al. | 438/616 |
| 6,153,505 A | | 11/2000 | Bolde et al. | |
| 6,213,386 B1 | | 4/2001 | Inoue et al. | |
| 6,231,333 B1 | * | 5/2001 | Gruber et al. | 425/546 |
| 6,444,561 B1 | * | 9/2002 | Wang et al. | 438/612 |

(Continued)

FOREIGN PATENT DOCUMENTS

| | | | |
|---|---|---|---|
| JP | 2004-228226 | * | 8/2004 |
| WO | WO 2010/015678 | | 2/2010 |

OTHER PUBLICATIONS

Manual Micro-ball Mounter Developed, Hitachi Metals, Ltd., Sep. 28, 2005, https://www.hitachi-metals.co.jp/e/press/news/2005/n0928.htm, pp. 1-6.

(Continued)

*Primary Examiner* — Charles Garber
*Assistant Examiner* — Ron Pompey
(74) *Attorney, Agent, or Firm* — Daniel P. Morris; Ryan, Mason & Lewis, LLP

(57) ABSTRACT

An assembly is obtained; it includes a substrate; a plurality of wet-able pads formed on a surface of the substrate; and a solder resist layer deposited on the surface of the substrate and having an outer surface. At least the solder resist layer is formed with recessed regions defining volumes adjacent the wet-able pads. Molten solder is directly injected into the volumes adjacent the wet-able pads, such that the volumes adjacent the wet-able pads are filled with solder. The solder is allowed to solidify. It forms a plurality of solder structures adhered to the wet-able pads. The substrate and the solder are re-heated after the solidification, to re-flow the solder into generally spherical balls extending above the outer surface of the solder resist layer. The volumes adjacent the wet-able pads are configured and dimensioned to receive sufficient solder in the injecting step such that the generally spherical balls extend above the outer surface of the solder resist layer as a result of the re-heating step. In an alternative approach, solder injection and solidification are carried out in a nitrogen environment or a forming gas environment, and the reflow step may be omitted.

9 Claims, 22 Drawing Sheets

INITIAL SUBSTRATE

U.S. PATENT DOCUMENTS

| | | |
|---|---|---|
| 6,454,154 B1 * | 9/2002 | Pedigo .......................... 228/33 |
| 6,486,054 B1 | 11/2002 | Fan et al. |
| 6,750,549 B1 | 6/2004 | Chandran et al. |
| 7,410,833 B2 * | 8/2008 | Fogel et al. .................. 438/123 |
| 2003/0166331 A1 | 9/2003 | Tong et al. |
| 2004/0110366 A1 | 6/2004 | MacKay et al. |
| 2007/0096338 A1 | 5/2007 | Kim et al. |
| 2009/0093111 A1 | 4/2009 | Buchwalter et al. |
| 2009/0146316 A1 | 6/2009 | Jadhav et al. |
| 2009/0184419 A1 * | 7/2009 | Pendse ......................... 257/737 |
| 2010/0116871 A1 | 5/2010 | Gruber et al. |

OTHER PUBLICATIONS

Nah et al., A Study on Coining Processes of Solder Bumps on Organic Substrates, IEEE Transactions on Electronics Packaging Manufacturing, vol. 26, No. 2, Apr. 2003, pp. 166-172.

IBM, "Injection Molded Soldering" IBM Research Projects Mar. 14, 2008, p. 1, [online] URL=<http://web.archive.org/web/20080314120024/http://www.research.ibm.com/ims/>.

* cited by examiner

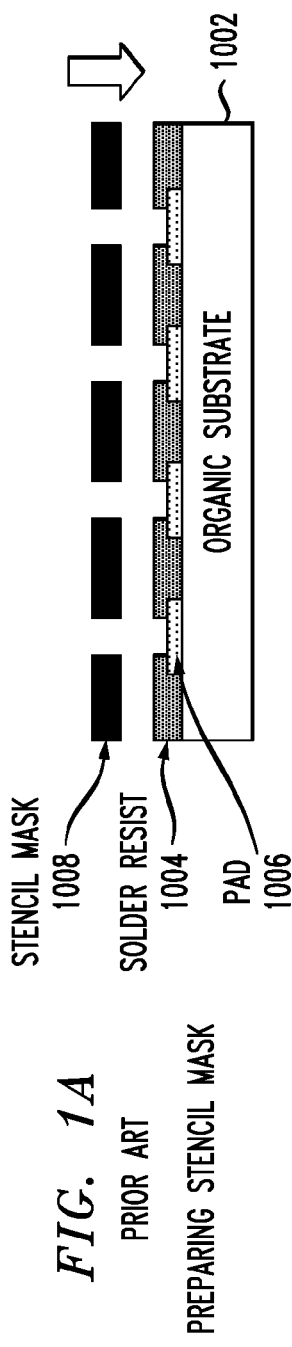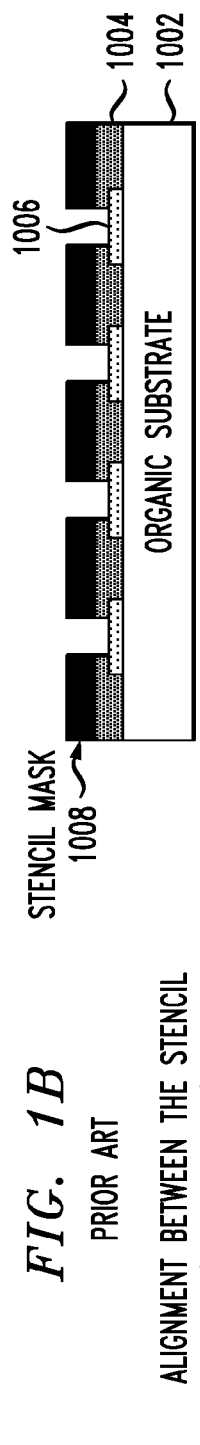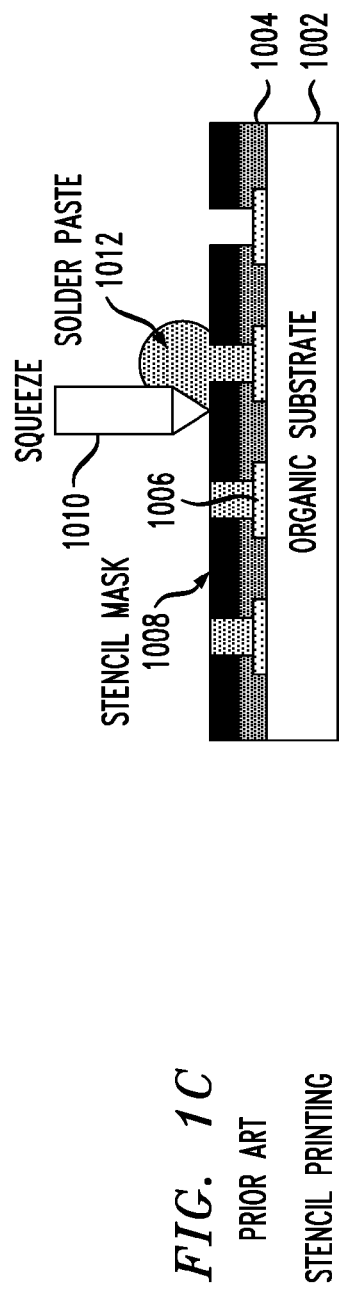

MASK REMOVE

SOLDER REFLOW

CLEANING FLUX RESIDUE

ALIGNMENT BETWEEN THE FLUX MASK AND THE PADS ON THE SUBSTRATE

APPLY TACKY FLUX

REMOVE FLUX MASK

ALIGNMENT BETWEEN THE BALL MASK AND THE PADS ON THE SUBSTRATE

DISPENSE PREFORMED SOLDER BALL

REMOVE MASK

SOLDER REFLOW

CLEANING FLUX RESIDUE

ORGANIC SUBSTRATE WITH WIDE OPENED SR

IMS

SOLDER REFLOW
(WITH FLUX OR FORMIC ACID)

ORGANIC SUBSTRATE
WITH WIDE OPENED SR
WHICH HAS DIFFERENT
PAD SIZES

IMS

SOLDER REFLOW
(WITH FLUX OR FORMIC ACID)

INITIAL SUBSTRATE

AFTER DIRECT IMS

AFTER REFLOW

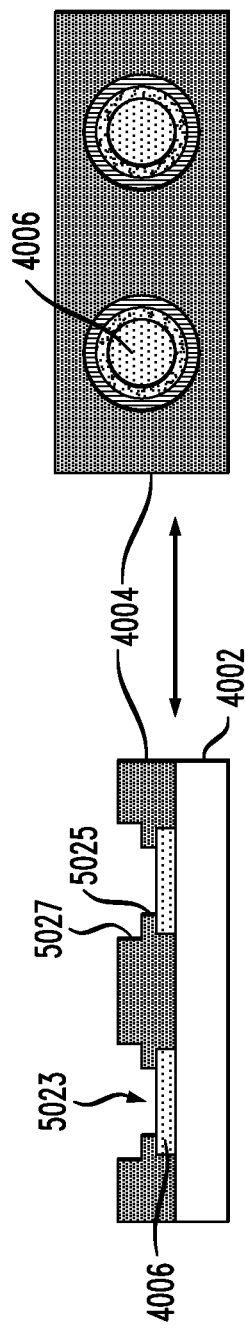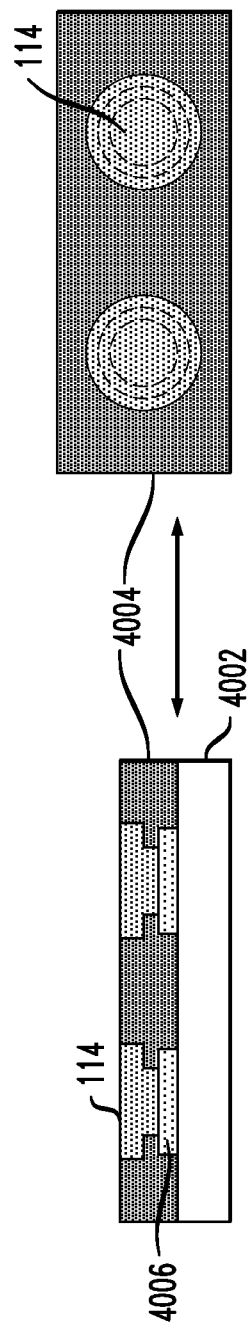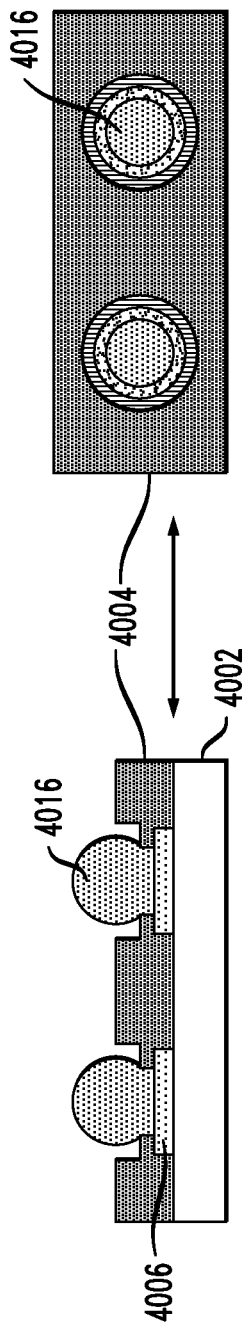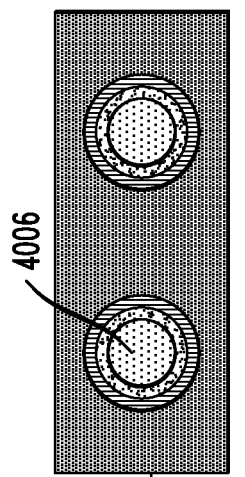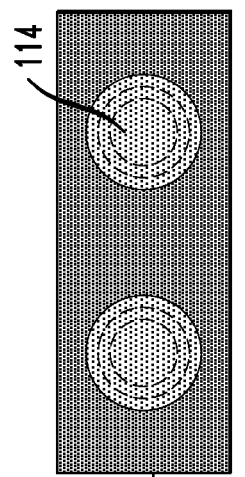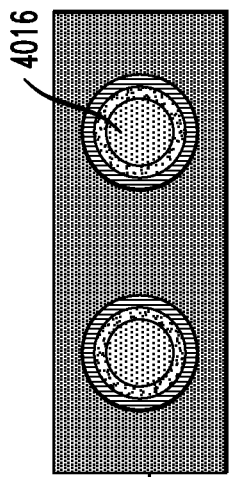
*FIG. 5E* INITIAL SUBSTRATE
*FIG. 5F* AFTER DIRECT IMS
*FIG. 5G* AFTER REFLOW

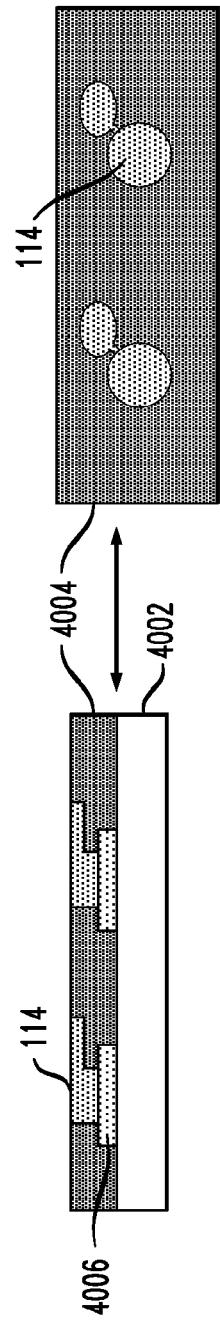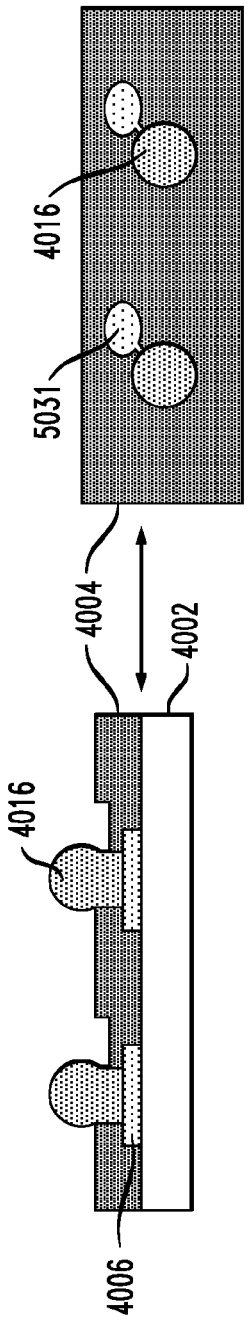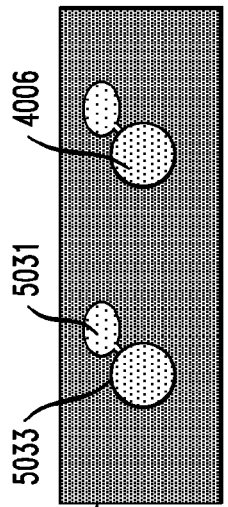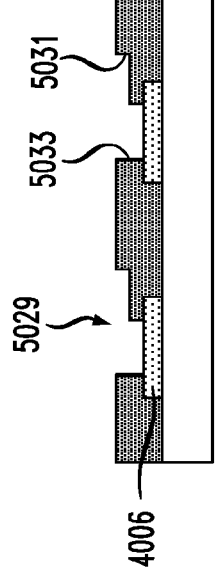
FIG. 5H INITIAL SUBSTRATE
FIG. 5I AFTER DIRECT IMS
FIG. 5J AFTER REFLOW

INITIAL SUBSTRATE

AFTER DIRECT IMS

AFTER REFLOW

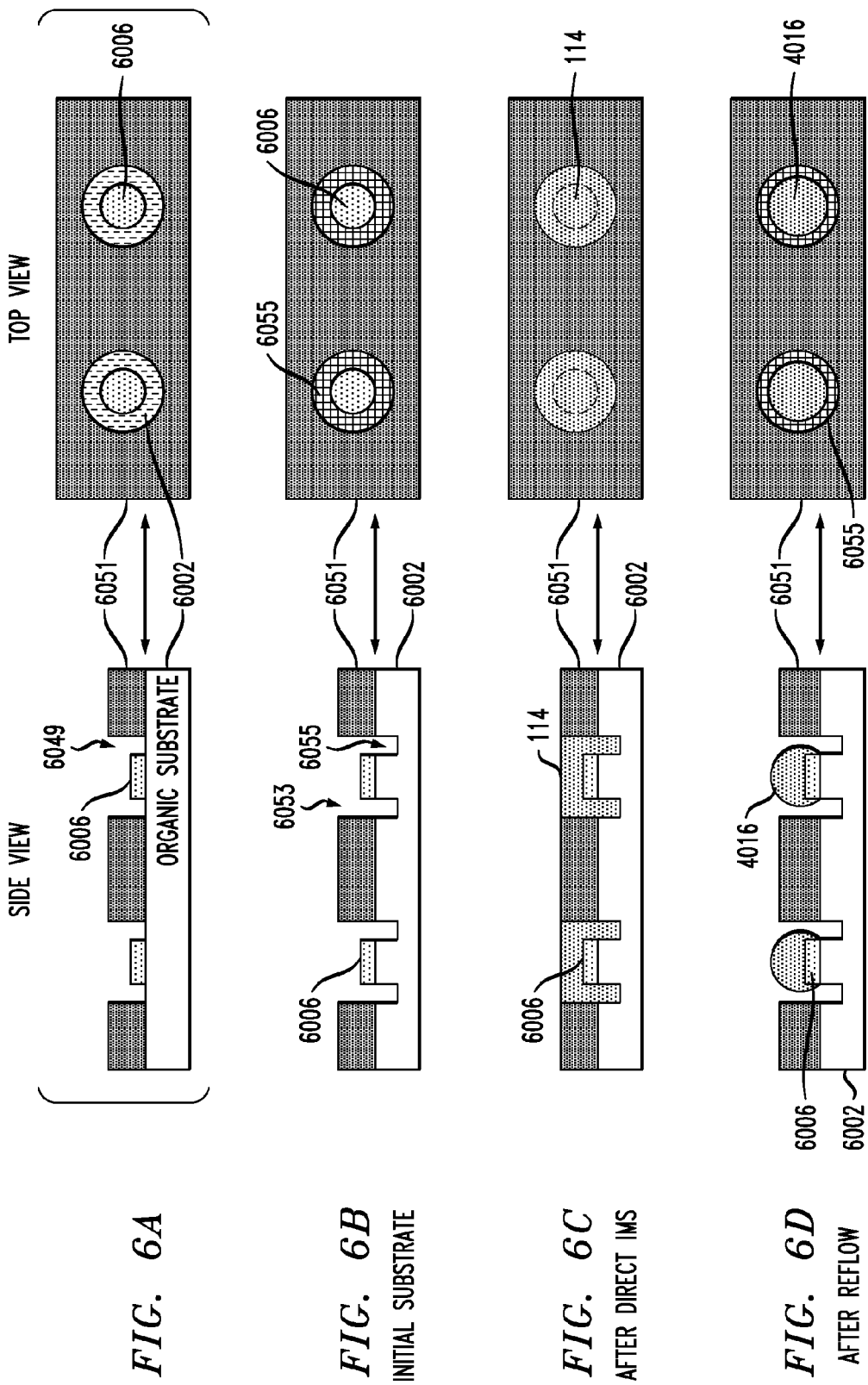

INITIAL SUBSTRATE

AFTER DIRECT IMS

AFTER REFLOW

ORGANIC SUBSTRATE WITH WIDE OPENED SR

IMS IN NITROGEN ENVIRONMENT

SOLIDIFY SOLDER IN NITROGEN ENVIRONMENT

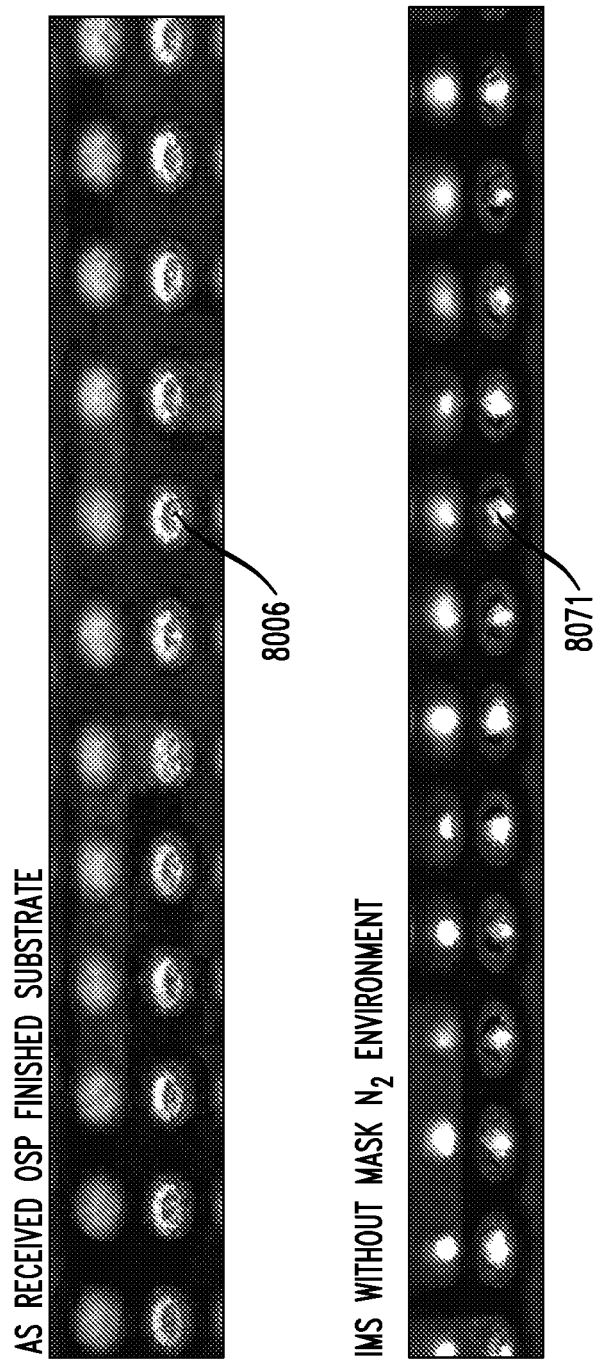

DIRECT IMS (INJECTION MOLDED SOLDER) WITHOUT A MASK FOR FORMING SOLDER BUMPS ON SUBSTRATES

FIELD OF THE INVENTION

The present invention generally relates to the electrical and electronic arts and, more particularly, to injection molded solder techniques, solder mask design methods, and solder deposition on substrates.

BACKGROUND OF THE INVENTION

J-W Nah et al., 'A Study on Coining Processes of Solder Bumps on Organic Substrates,' IEEE Transactions on electronics packaging manufacturing, Vol. 26, No. 2, April 2003, p. 166, shows a current high volume manufacturing method of forming solder bumps on laminates. The solder paste stencil printing method has been used for forming solder bumps on organic substrates for a long time. As seen in FIGS. 1A and 1B, an organic substrate 1002 is provided with a plurality of pads 1006 and a solder resist layer 1004. A stencil mask 1008 is aligned therewith. As in FIG. 1C, solder paste 1012 is dispensed through the holes in mask 1008 using a squeeze knife or blade 1010. The mask is removed as in FIG. 1D leaving upstanding solder paste regions 1014. FIG. 1E depicts reflow wherein regions 1014 become rounded bumps 1016 with flux residue 1018 thereon. The same is cleaned away in FIG. 1F leaving solder balls 1016 with a projecting height above the resist shown at 1020.

FIGS. 1A-1F thus illustrate a prior-art technique for forming solder bumps on substrates. Solder paste is stencil printed through a mask aligned to the substrate solder resist (SR) openings. The mask enables deposition of solder paste material that stands above the SR after mask removal.

However, commercial applications of the solder paste stencil printing method are limited to substrates with pitches greater than or equal to 150 microns because the high volume percentage of flux (around 50 volume %) in the solder paste hinders formation of high volume solder bumps without solder bridging.

U.S. Pat. No. 6,213,386 of Inoue et al., entitled 'Method of forming bumps,' discloses wherein solder balls and a tool having a large number of through-holes are used, and under the condition that the through-holes of the tool are aligned with the pads of the semiconductor device, the solder balls are charged into the through-holes, pressed to be fixed on the pads, and then reflowed to form bumps.

FIGS. 2A-2H illustrate a prior-art pre-formed solder ball mounting method for fine pitch applications under 150 microns pitch. Elements similar to those in FIGS. 1A-1F have received the same reference character. As seen in FIG. 2A, an organic substrate 1002 is provided with a plurality of pads 1006 and a solder resist layer 1004. A mask for flux 2020 is aligned therewith. As in FIG. 2B, tacky flux 2002 is applied, and as in FIG. 2C, mask 2020 with adherent flux 2002 is removed, leaving flux portions 2004 on pads 1006. A mask 2006 for solder ball dispensing is aligned with the pads, as in FIG. 2D, and in FIG. 2E, preformed solder balls 2008 are located in openings in the mask 2006, in contact with flux portions 2004, which retain them when the mask 2006 is removed as in FIG. 2F. FIG. 2G and 2H depict reflow and flux cleansing and are similar to FIGS. 1E and 1F.

FIGS. 2A-2H thus illustrate another prior-art technique for forming solder bumps on substrates; the so-called micro ball mounting method wherein two masks are used: one to dispense tacky flux and the other to place preformed solder balls on the pads of the substrate. The tacky flux makes the balls stick to the bottom of the SR opening.

Solder balls 2008 may be expensive and flux application and solder ball dispensing may be somewhat complex. Furthermore, this type of technology needs additional steps to form uniform height solder bumps on different size pads.

SUMMARY OF THE INVENTION

Principles of the present invention provide techniques for direct IMS (injection molded solder) without a mask for forming solder bumps on substrates. An exemplary method includes the step of obtaining an assembly comprising a substrate; a plurality of wet-able pads formed on a surface of the substrate; and a solder resist layer deposited on the surface of the substrate and having an outer surface. At least the solder resist layer is formed with recessed regions defining volumes adjacent the wet-able pads. The method also includes directly injecting molten solder into the volumes adjacent the wet-able pads, such that the volumes adjacent the wet-able pads are filled with solder; allowing the solder to solidify, whereby the solder forms a plurality of solder structures adhered to the wet-able pads; and re-heating the substrate and the solder after the solidification, to re-flow the solder into generally spherical balls extending above the outer surface of the solder resist layer. The volumes adjacent the wet-able pads are configured and dimensioned to receive sufficient solder in the injecting step such that the generally spherical balls extend above the outer surface of the solder resist layer as a result of the re-heating step.

In another aspect, another exemplary method includes the step of obtaining an assembly comprising a substrate; a plurality of wet-able pads formed on a surface of the substrate; and a solder resist layer deposited on the surface of the substrate and having an outer surface. At least the solder resist layer is formed with recessed regions defining volumes adjacent the wet-able pads. Additional steps include directly injecting molten solder into the volumes adjacent the wet-able pads, such that the volumes adjacent the wet-able pads are filled with solder, the injecting being carried out in one of a nitrogen environment and a forming gas environment; and allowing the solder to solidify, whereby the solder forms a plurality of at least partially spherical solder structures adhered to the wet-able pads, the solidification being carried out in the one of the nitrogen environment and the forming gas environment. The volumes adjacent the wet-able pads are configured and dimensioned to receive sufficient solder in the injecting step such that the generally spherical solder structures extend above the outer surface of the solder resist layer as a result of the solidification step.

These and other objects, features and advantages of the present invention will become apparent from the following detailed description of illustrative embodiments thereof, which is to be read in connection with the accompanying drawings (note that section lining is generally omitted from the drawings, except with respect to mask 102 in FIGS. 3A-3D, in order to avoid clutter).

BRIEF DESCRIPTION OF THE DRAWINGS

FIGS. 1A-1F schematically depict a prior-art solder paste stencil method (a high volume manufacturing method for forming solder bumps on substrates);

FIGS. 5A-5M schematically depict an exemplary direct substrate IMS process without mask exercised with an SMD (solder mask defined) substrate having wide-open SR, according to another aspect of the invention (with a baseline for comparison);

FIGS. 6A-6G schematically depict an exemplary direct substrate IMS process without mask exercised with an NSMD (non solder mask defined) substrate having a deep SR opening, according to still another aspect of the invention (with a baseline for comparison);

FIGS. 8A-8E schematically depict direct substrate IMS without mask, on a laminate having the industry standard SR opening.

DETAILED DESCRIPTION OF PREFERRED EMBODIMENTS

Figure 3A:
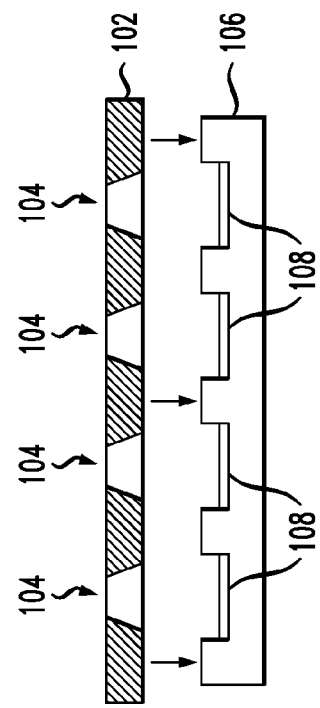
FIGS. 3A-3F schematically depict a substrate IMS with mask process of U.S. patent application Ser. No. 12/269,240.
Figure 3B:
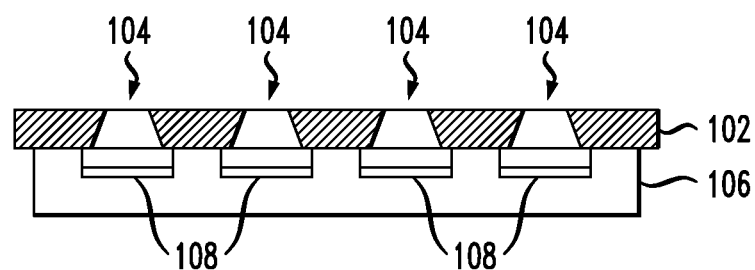

Initially, the complete disclosure of U.S. patent application Ser. No. 12/269,240 of Gruber et al., filed Nov. 12, 2008, entitled "Injection Molded Solder Method for Forming Solder Bumps on Substrates" ("the '240 application") is expressly incorporated herein by reference in its entirety for all purposes. FIGS. 3A-3F depict certain techniques of the '240 application. Attention should now be given to FIGS. 3A and 3B. As seen therein, a mask 102 includes a plurality of through holes 104 arranged in a desired pattern. The mask 104 is located adjacent a substrate 106. The substrate may be, for example, an organic substrate with a plurality of wet-able pads 108 (for example, copper, gold, nickel, and the like) located in recesses. The mask may be, for example, a polyimide film or a thin material that does not react with solder (e.g., non-wetting metals such as molybdenum, stainless steel, aluminum, and the like). As shown in FIG. 3A, the mask 102 is aligned to the substrate 106 so that holes 104 align with pads 108. Note that holes 104 are preferably not of uniform diameter, but rather frustoconical, with the larger diameter adjacent substrate 106 as seen in FIG. 3B. The assembly in FIG. 3B is ready to receive solder.

Non-limiting examples of organic substrates include laminate materials made of glass fibers in an epoxy; for example, FR-4 (flame retardant type 4) and BT-resin (Bismaleimide Triazine resin). Furthermore, it should be noted that techniques of the '240 application are not limited to organic substrates; element 106 is also representative of a silicon wafer, as aspects of the '240 application can also be employed to create solder bumps on silicon wafers. Thus, the wet-able pads 108 depicted in the figures represent wet-able pads and also encompass ball-limiting metallurgy, in the case of a silicon substrate.

Figure 3C:
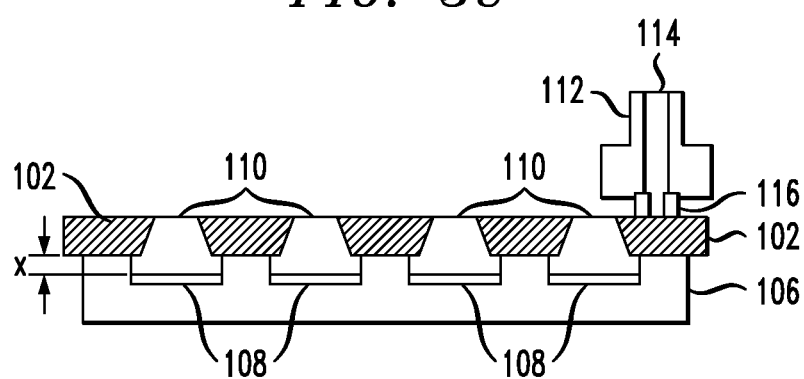
Figure 3D:
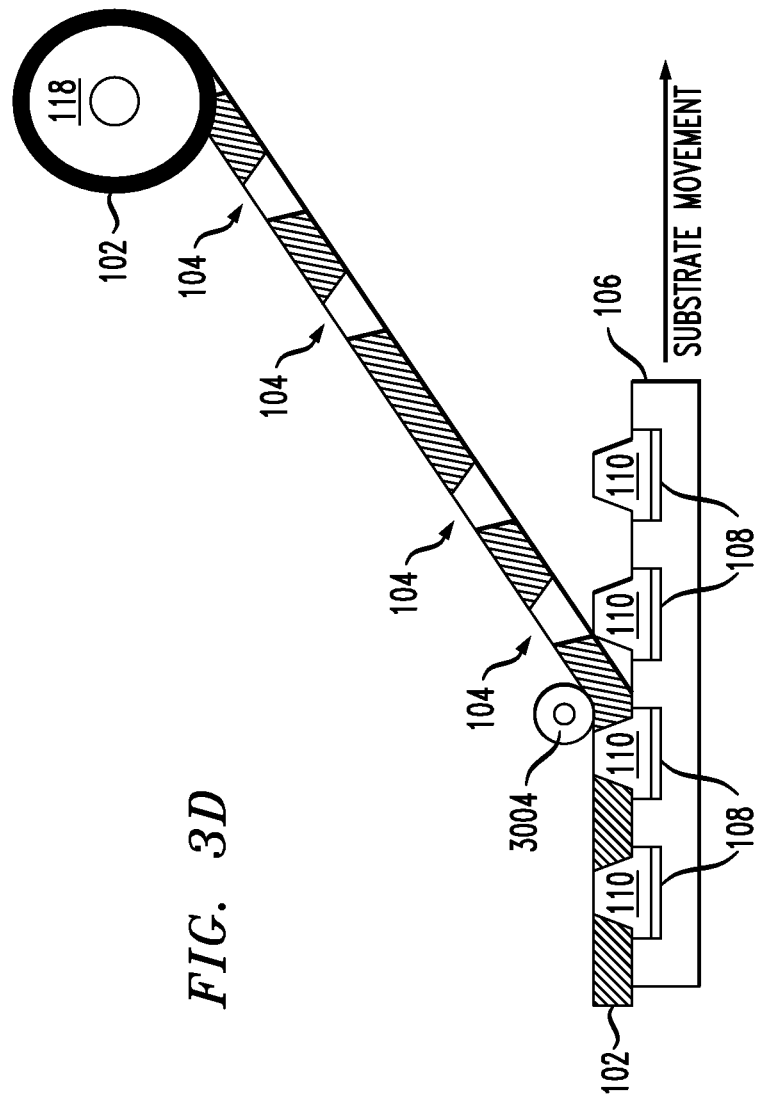
Figure 3E:
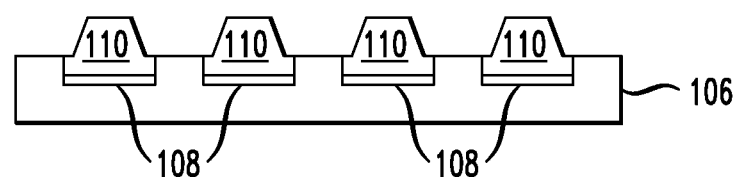
Figure 3F:
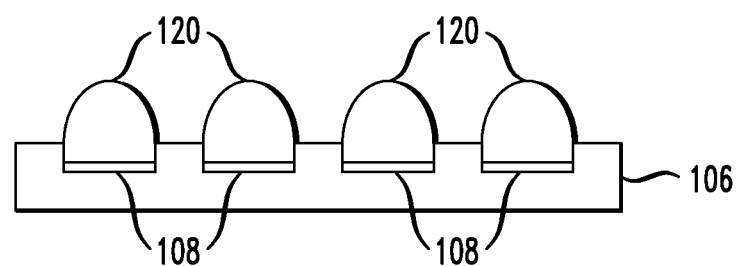

A solder fill process is shown in FIG. 3C, wherein fill head 112 dispenses solder 114 into the holes 104 and the recessed regions with pads of wet-able material 108 to form solder structures 110. As best seen in FIG. 3C, the recessed regions may be such that the top surface of the pads of wet-able material is recessed below the top surface of the substrate 106 by a distance X of about 5-15 microns. This results in a "shoulder" of solder material. Fill head 112 is provided with compliant material 116 for purposes to be discussed below. As seen in FIGS. 3D and 3E, after solder solidification, the mask 102 (also referred to herein as a "decal" or "decal layer") is peeled away onto a reel 118 with the aid of a peel roller 3004 (peel roller 3004 may be provided to aid in peeling mask 102 from substrates 106). Because holes 104 are frustoconical with the wide side towards substrate 106, they are not re-entrant, and decal 102 peels relatively easily, without undue mechanical stress on structures 110 or substrate 106. Optionally, as seen in FIG. 3F, a reflow process is conducted such that solder structures 110 become substantially hemispherical solder bumps 120.

With regard to compliant material 116, note that substrate 106 may be formed, for example, from a base substrate with solder resist (SR). Wet-able pads (e.g., copper) are shown at 108. The upper surface of the solder resist is not perfectly flat, but includes topographical features. These will prevent a perfect seal with decal mask 102, thus resulting in a small gap with concomitant leakage of solder during the IMS process. Fill head 112, which may be, for example, glass or metal, is provided with compliant material 116, which spreads out (distributes uniformly, or nearly so) the compressive force between (i) head 112 and (ii) decal 102 on substrate 106, resulting in good contact between mask 102 and substrate 106, such that gaps that would cause undesirable leakage are reduced or eliminated. The mask 102 is sufficiently flexible to track the topography of the substrate 106, under the influence of the compressive force that is distributed by compliant material 116.

Compliant material 116 may include, for example, a bulk compressible layer with a thin low-friction layer adjacent mask 102. Non-limiting examples of compliant materials for the bulk compressible layer are silicone rubber and silicone closed cell sponge. Non-limiting examples of materials for the low-friction layer are fluoropolymers such as Teflon® (registered mark of E. I. Du Pont De Nemours And Company, Wilmington, Del., USA) and Rulon® TFE Fluorocarbon (registered mark of Saint-Gobain Performance Plastics Corporation, Aurora, Ohio USA). The low-friction layer may be just thick enough to resist abrasion, for example. The total thickness of the low friction layer plus the bulk compressible layer may be, for example, from about $\frac{1}{32}$ inch to about $\frac{1}{4}$ inch, with a preferred thickness of about $\frac{1}{16}$ inch (from about 0.79 mm to about 6.35 mm, with a preferred thickness of about 1.59 mm). The contact pressure may be about 10 to about 60 pounds per square inch (PSI) with a preferred value of about 15 PSI (about 68.9 to about 414 kilo-Pascals with a preferred value of about 103 kilo-Pascals).

FIGS. 3A-3F thus illustrate injection of molten solder with a mask process. Solder bumps are formed on the pads of the substrate with the mask ensuring enough solder volume above the SR surface. The direct injection of molten solder with a flexible mask has demonstrated 80 micron pitch solder bumping on a substrate. Such techniques advantageously provide simple molten solder injection with a flexible film mask for forming high volume solder bumps on very fine pitch laminates which have less than 80 micron pitch. Embodiments of such method may use a mask which requires an alignment step between the film mask and the laminate when the industry standard panel sized substrate is used.

One or more embodiments of the present invention provide a method for forming solder bumps on organic substrates by using direct IMS on substrates without a mask. By manipulation of the opening in the solder resist (SR) it is possible to enable variations in the volume of solder bumps. Therefore, there is no issue with alignment between holes in a mask and pads on a substrate. Since mask alignment is a time-consuming process step, the elimination of this step lowers process cost and makes the process more reliable.

In another aspect, an SR opening that is wider than the wet-able metal pad is fabricated. This opening can accept a larger volume of injected solder material than a standard SR pad opening. During the subsequent reflow process the solder moves from the non-wetting, pure SR area to the wet-able metal area. Therefore, a higher volume solder bump which has a height above the SR surface can be achieved.

In some instances, a nitrogen environment during the IMS process serves to make the solder "ball-up" during the solidification of the injected molten solder. Thus, the presence of a nitrogen environment has the potential to eliminate the subsequent reflow process typically used in other cases. This reduces the number of process steps and thus cost.

The solder paste of certain prior-art processes leads to SR openings which are only about 50% volume filled by solder since the solder paste includes about 50 volume percent solder powder and about 50 volume percent flux. After reflow of this solder paste, only about 50 volume percent of the solder paste remains to make the solder bump in the SR opening over the solder pad. To raise the solder volume, a fill process mask has heretofore been a requirement. The mask adds volume to the SR opening and must be thick enough to raise the solder remaining after reflow above the SR surface.

For the avoidance of doubt, note that in the '240 application, a base substrate with solder resist (SR) is referred to as a substrate; however, in the remainder of this application, the base substrate is referred to simply as a substrate, for brevity.

Figure 4A:
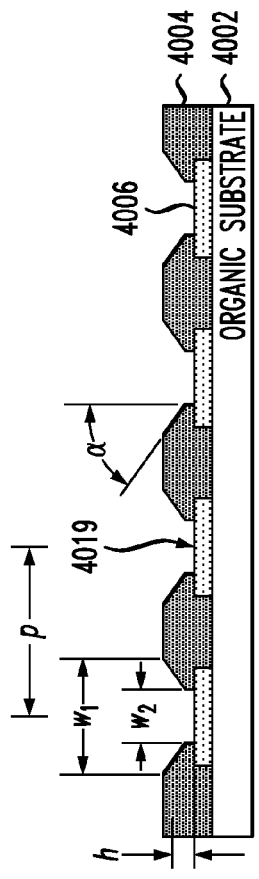
FIGS. 4A-4C schematically depict, at a high level, an exemplary direct substrate IMS process without mask, according to an aspect of the invention.
Figure 4B:
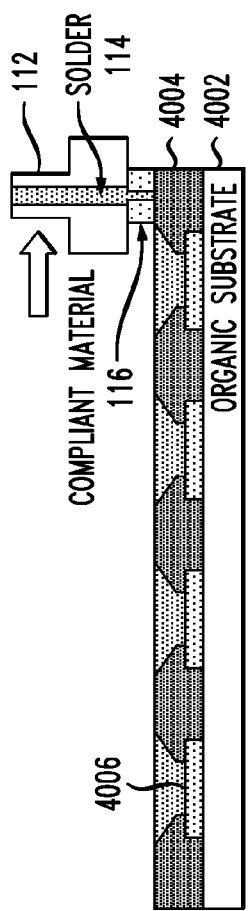
Figure 4C:
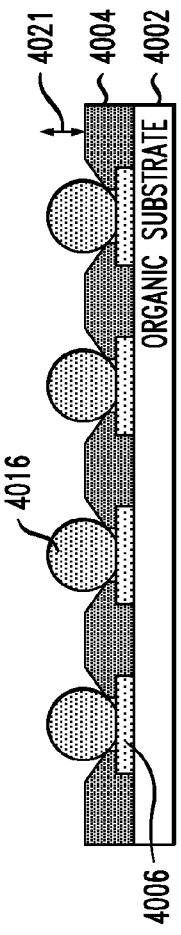

FIGS. 4A-4C schematically depict, at a high level, an exemplary direct substrate IMS process without mask, according to an aspect of the invention. Note organic substrate 4002 with pads 4006 and SR 4004. In the exemplary method for forming solder bumps, enough solder volume is provided above the SR surface by direct IMS. This is achieved by proper design of the SR opening 4019. The "wide open" SR allows a greater volume of molten solder to be injected on the pads. The subsequent solder reflow process makes spherical solder bumps 4016 which protrude above the SR surface sufficiently to ensure good flip chip assembly yield, as shown at 4021.

The process shown in FIGS. 4A-4C is simple, and does not require a mask or an alignment step. Any size substrate 4002 can be used, up to and including a panel size. As seen in FIG. 4A, the top surface of the SR may project a height h above the top of the pads 4006. The diameter of the "wide open" SR at the bottom, adjacent pads 4006 is designated as $w_2$, while the diameter of the "wide open" SR at the top is designated as $w_1$. The angle with the vertical is designated as a.

The value of h, by way of example and not limitation, may be between 5 microns and 25 microns. The value depends on the application and/or the pitch of the substrates. The value of $w_2$ depends on the pitch of the substrates. For example, a 200 microns pitch substrate has around 100 microns diameter $w_2$ and a 150 microns pitch substrate has around 80 microns diameter $w_2$. The value of $w_1$ can decide the height of the solder bump over the SR after the solder reflow. If the pitch is defined as p (as in FIG. 4A), a workable range, in one or more embodiments, is $w_1 < w_2 < p$.

The IMS process is shown in FIG. 4B. The above-described head 112 with compliant material 116 may be used to dispense solder 114, in a non-limiting example. In FIG. 4C, solder reflow is carried out with flux or in a formic acid environment, yielding solder balls 4016.

Figure 4D:
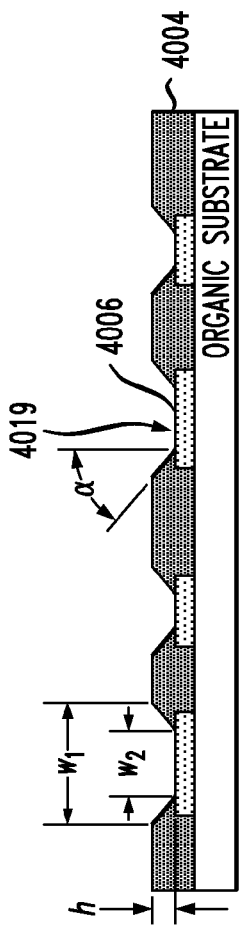
FIGS. 4D-4F schematically depict, at a high level, an exemplary direct substrate IMS process without mask where pads of different size are used, resulting in different sizes and/or shapes of solder balls, according to an aspect of the invention.
Figure 4E:
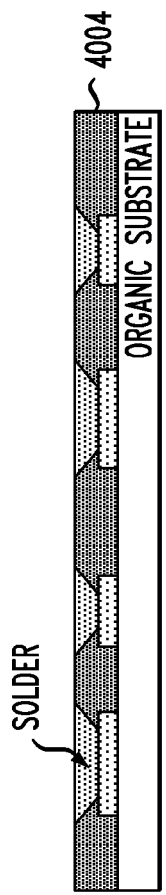
Figure 4F:
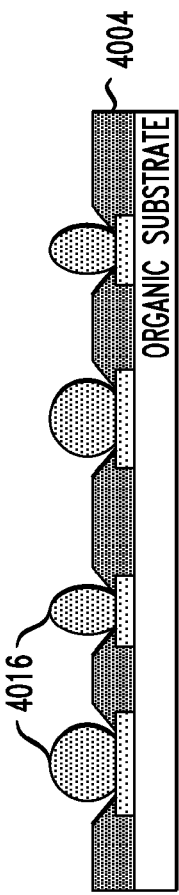

FIGS. 4D-4F are similar to FIGS. 4A-4C, but show a case where pads of different size are used, resulting in different sizes and/or shapes of solder balls 4016.

Figure 1D:
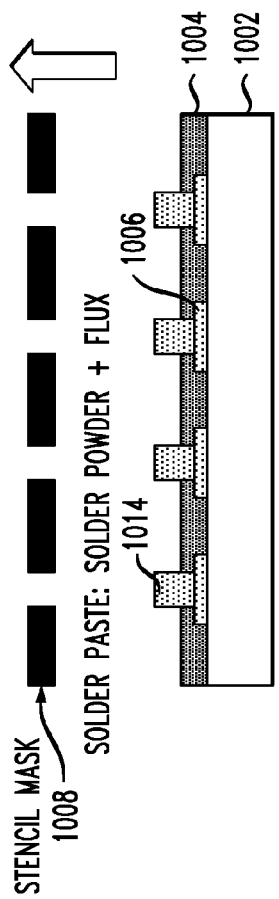
Figure 1E:
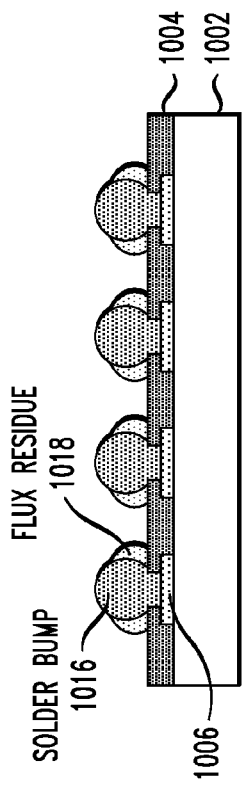
Figure 1F:
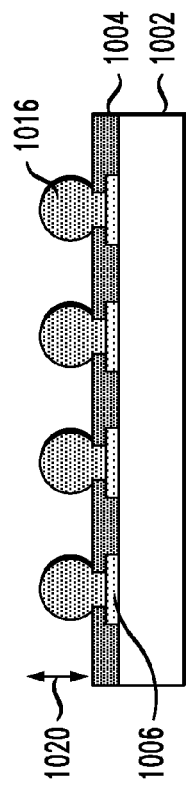
Figure 2A:
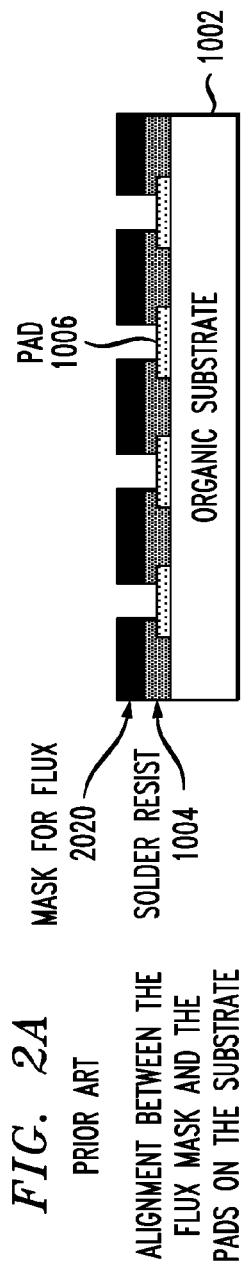
FIGS. 2A-2H schematically depict a prior-art micro ball mounting method for forming solder bumps on substrates.
Figure 2B:
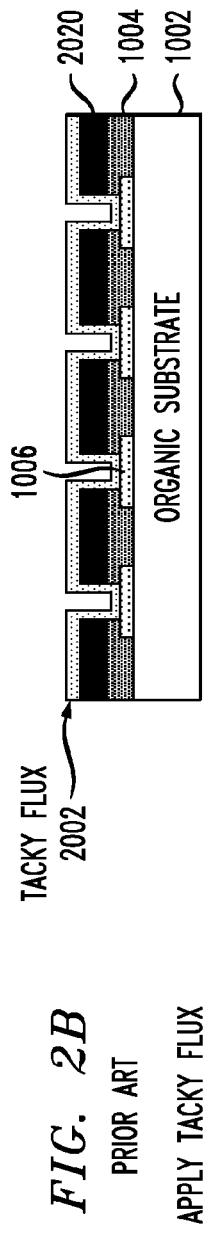
Figure 2C:
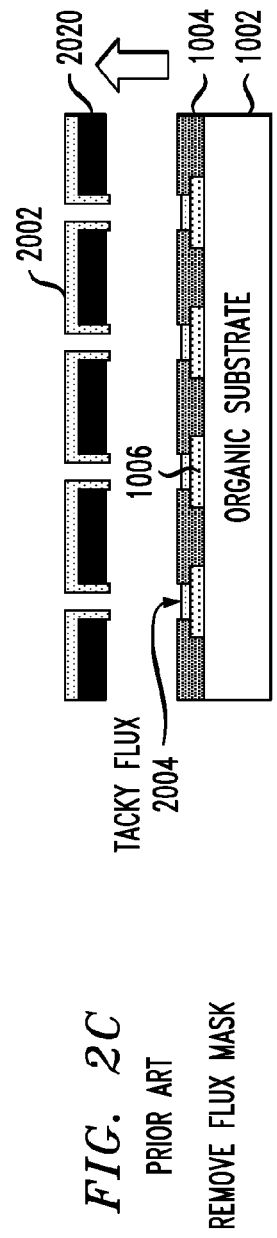
Figure 2D:
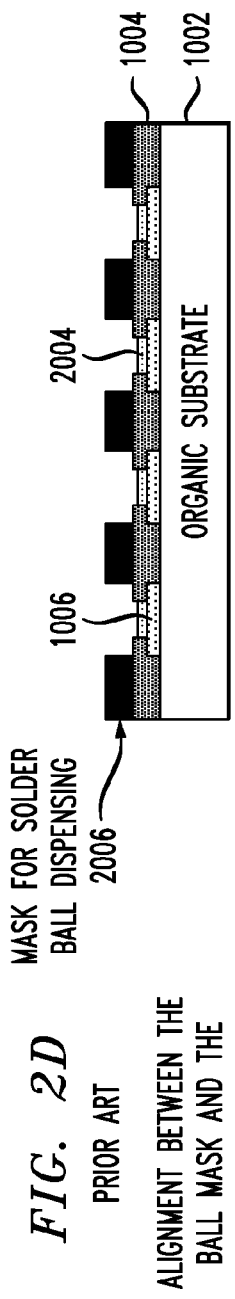
Figure 2E:
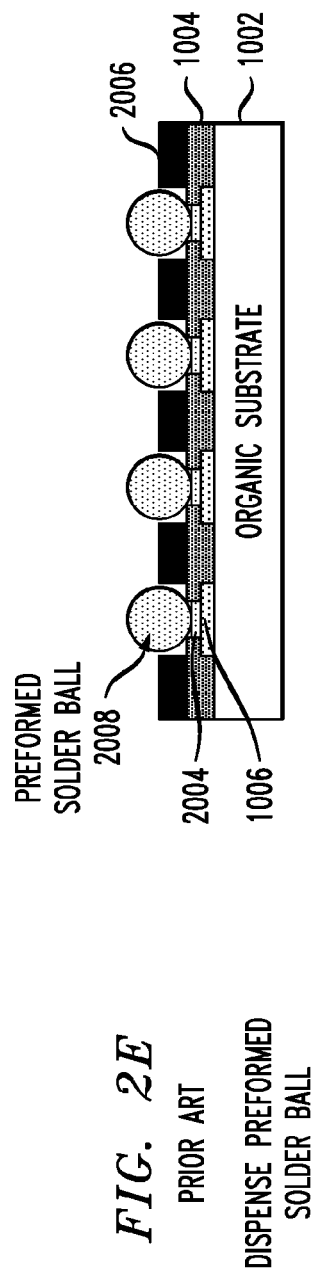
Figure 2F:
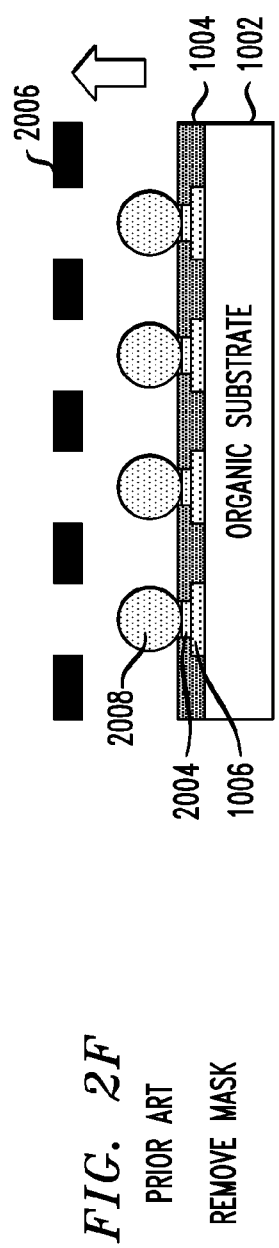
Figure 2G:
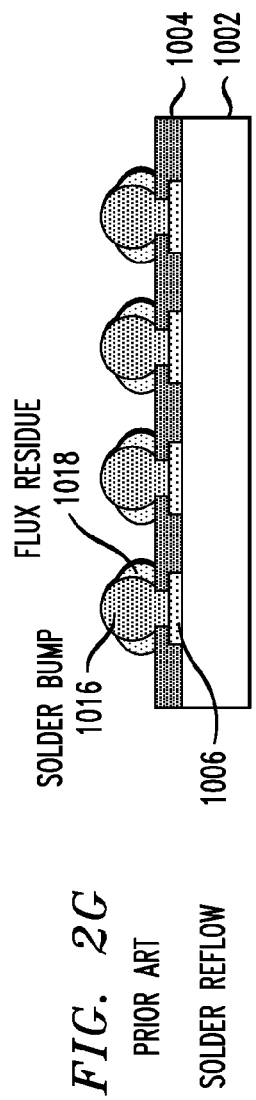
Figure 2H:
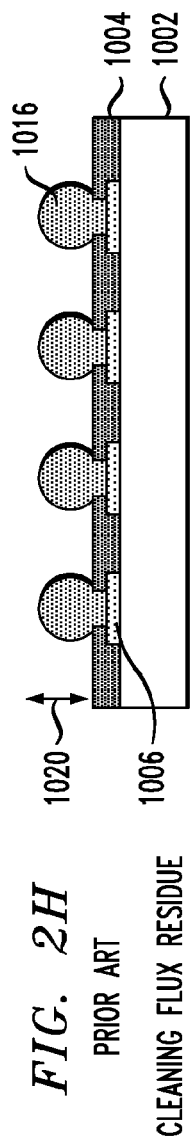
Figure 5A:
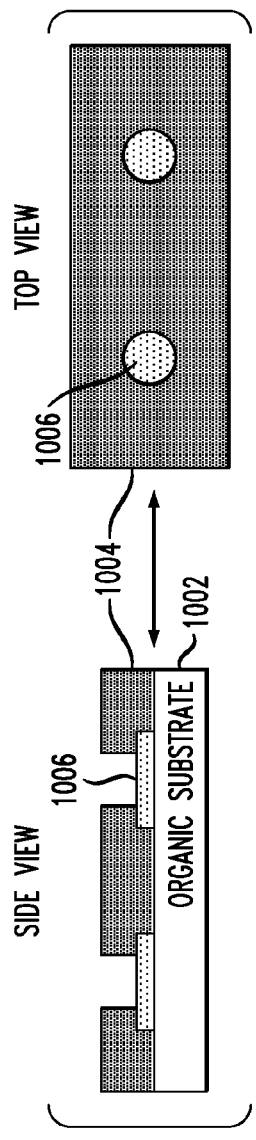
Figure 5B:
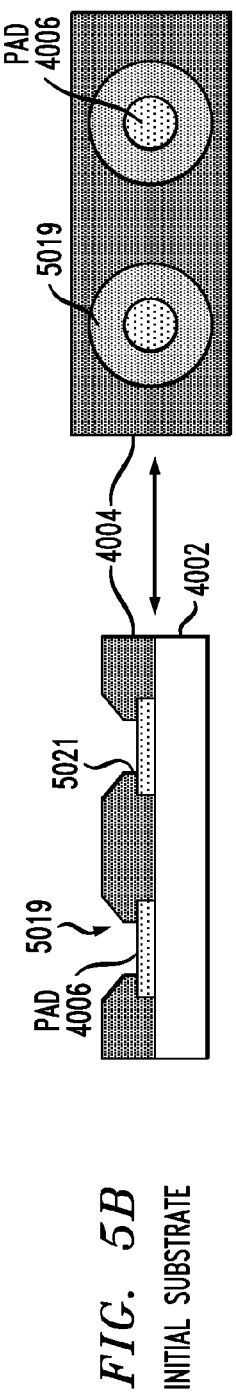
Figure 5C:
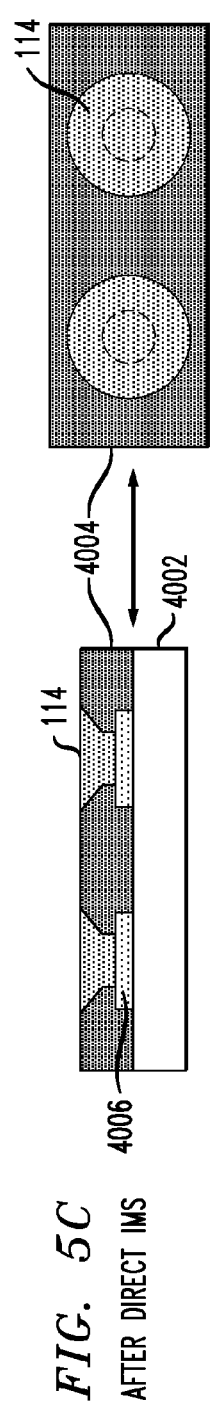
Figure 5D:
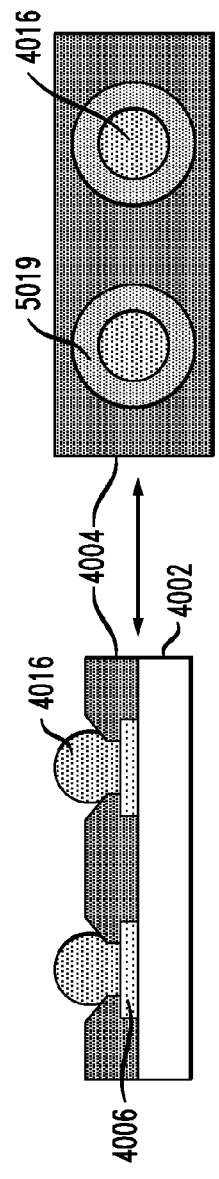

FIG. 5A shows a baseline similar to FIG. 1A for comparison purposes. Refer, for example, to US Patent Publication 2009-0146316. FIGS. 5B-5M depict various exemplary designs of SR openings for forming high volume IMS solder bumps on pads without a mask in the case of SMD (solder mask defined) substrates, according to aspects of the invention. FIGS. 5B-5D are generally similar to FIGS. 4A-4C, with top views depicted at the right side of the figure. The openings 5019 in the SR are circular in the top view. Furthermore, the openings 5019 are funnel-shaped in the side view, with a short straight region 5021.

In FIGS. 5B-5D, as above, the value of $w_1$ can decide the height of the solder bump over the SR after the solder reflow. It is generally acceptable if there is not any overlap among the neighboring SR openings.

FIGS. 5E-5G are similar to FIGS. 5B-5D, but for an embodiment where openings 5023 are "stepped" having small-diameter region 5025 near pad 4006 and large-diameter region 5027. The openings 5023 in the SR with regions 5025, 5027 are circular in the top view. The openings can be sized using principles similar to those above; it is generally acceptable if there is not any overlap among the neighboring SR openings.

FIGS. 5H-5J are similar to FIGS. 5B-5D, but for an embodiment where openings 5029 have offset "reservoirs" 5031. The main portions 5033 of the openings 5029 in the SR are circular in the top view. The reservoir regions 5031 are in fluid communication with the main portions 5033. The openings can be sized using principles similar to those above; it is generally acceptable if there is not any overlap among the neighboring SR openings.

Figure 5K:
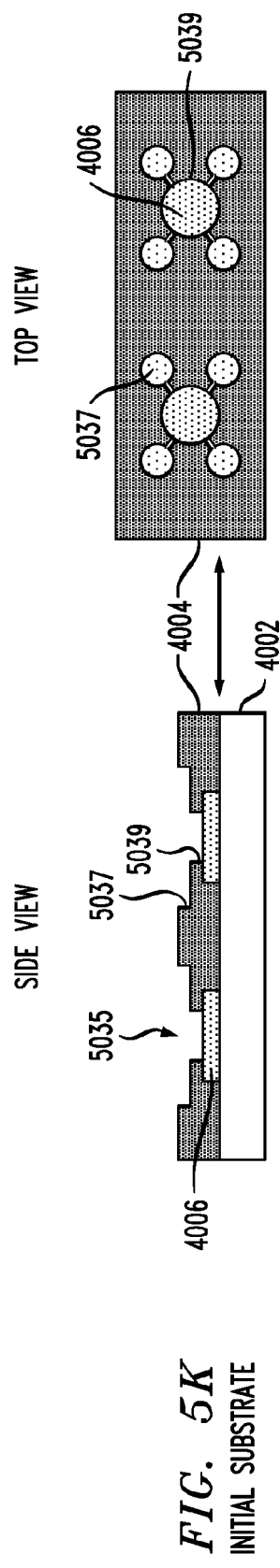
Figure 5L:
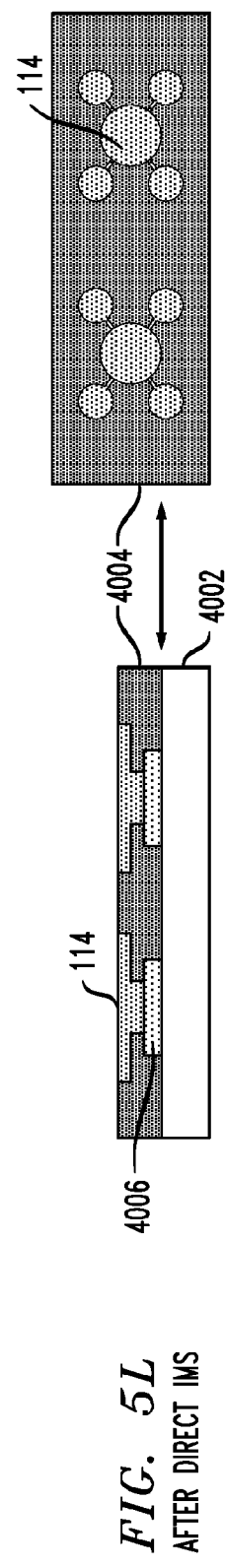
Figure 5M:
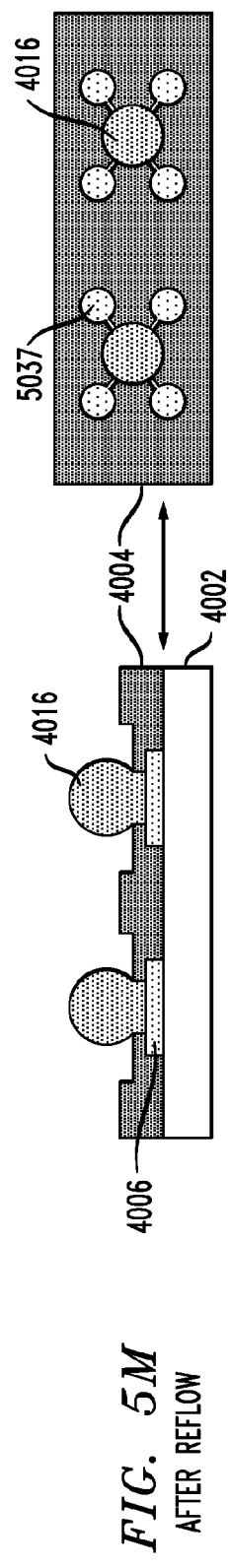

FIGS. 5K-5M are similar to FIGS. 5B-5D, but for an embodiment where openings 5035 have a plurality of offset "reservoirs" 5037. The main portions 5039 of the openings 5035 in the SR, as well as the reservoirs 5037, are circular in the top view. The reservoir regions 5037 are in fluid communication with the main portions 5039. The openings can be sized using principles similar to those above; it is generally acceptable if there is not any overlap among the neighboring SR openings.

FIG. 6A shows a baseline aspect somewhat similar to FIG. 1A for comparison purposes, but wherein the pads 6006 are within large openings 6049 in the SR 6051, such that portions of the surface of substrate 6002 are visible adjacent pads 6006. Refer, for example, to US Patent Publication 2009-0184419, which is one example of NSMD (nod solder mask defined) substrates. 'Non-solder-mask-defined' means that the copper pads 6006 of the substrates are not covered by the solder resist 6049. 'SMD (solder mask defined)' means that the copper pads are covered by the solder resist.

Figure 6E:
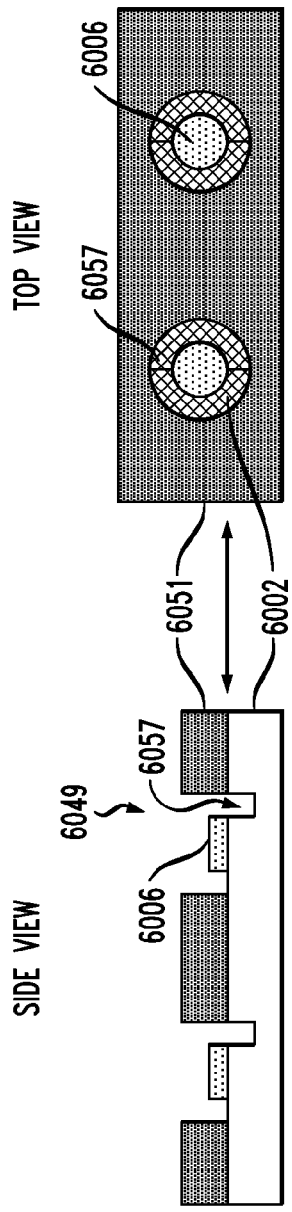
Figure 6F:
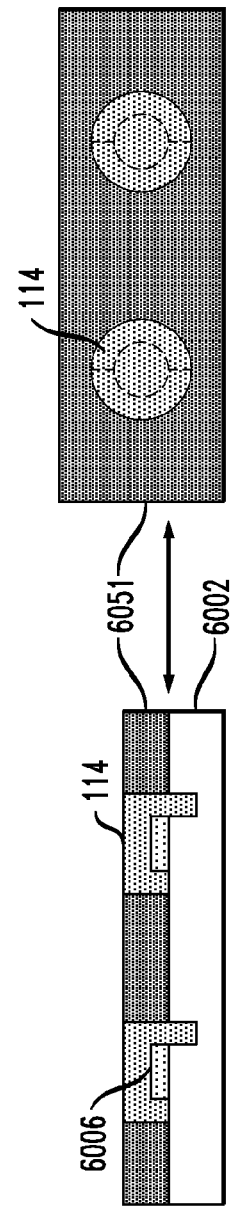
Figure 6G:
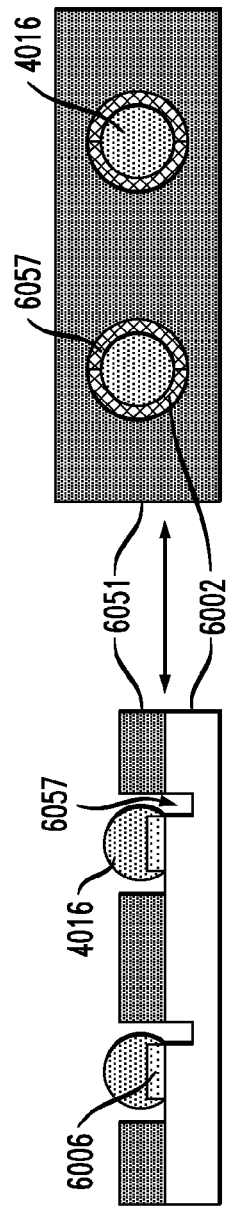

FIGS. 6B-6G illustrate various exemplary designs of deep SR openings for forming high volume IMS solder bumps on the pads without a mask in the case of NSMD (non solder mask defined) substrates, according to aspects of the invention. In FIGS. 6B-6D, openings 6053 are larger than pads 6006, as for openings 6049 in FIG. 6A; however, a surrounding trench 6055 is formed in the substrate itself. The solder has an adhesion (wetting) with the copper pads but it does not have an adhesion with the solder resist. In FIGS. 6D and 6G, note that the solder covers the side wall of the copper pads. The trench is filled with solder 114, as in FIG. 6C, and due to surface tension, after reflow, the structure depicted in FIG. 6D is obtained, with solder balls 4016. The trenches 6055 and pads 6006 are circular in the top views.

FIGS. 6E-6G are similar to FIGS. 6B-6D, except that the trenches 6057 do not extend around the complete circumference of the pads 6006. Purely for example, trenches 6057 extending over half the circumference of the pads 6006 are shown.

Note FIGS. 6B-6D show three steps of as received, IMS, and reflow, while FIGS. 6E-6G shows examples of different SR designs. As far as an "NSMD type substrate," in the NSMD case, the SR does not cover the copper pads as in the SMD type.

In FIG. 6E, in the top view, the top of substrate 6002 and the bottom of trench 6057 in substrate 6002 are visible surrounding pads 6006. In FIG. 6F, the entire opening 6049, including trench 6057, is filled with solder 114. Due to surface tension, after reflow, the structure depicted in FIG. 6G is obtained, with solder balls 4016. The solder is only wetting on the copper pads, but it is not wetting on the SR after the reflow. In FIG. 6G, in the top view, the top of substrate 6002 and the bottom of trench 6057 in substrate 6002 are again visible.

Note that the solder-receiving volumes for the embodiments of FIGS. 6 and 7 can also be sized using similar techniques to those set forth above; overlap among the neighboring SR openings should be avoided. Also, the depth can define the height of the solder bumps over SR after reflow. For any of the embodiments herein, the skilled artisan, given the teachings herein, will be able to perform geometric calculations to size the solder-receiving volumes such that the solder balls or blobs project above the surface of the solder resist at completion. For example, the approximate shape of the solder balls or blobs will be known based on the tendency to assume spherical shapes under surface tension, together with knowledge of which surfaces wet and which do not; the solder-receiving volumes are configured and dimensioned to have sufficient volume such that the volume of solder therein, upon reflow or solidification in Nitrogen or forming gas environment, will form a shape of ball or blob that projects as desired. Thus, the skilled person, given the teachings herein can easily calculate the relation between the opening volume of SR and the height of solder over SR.

Figure 7A:
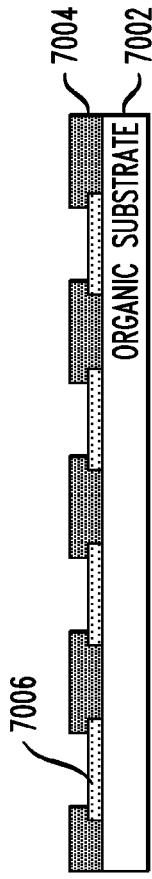
FIGS. 7A-7C schematically depict a direct substrate IMS process without mask (exercised in a nitrogen environment) according to a further aspect of the invention.
Figure 7B:
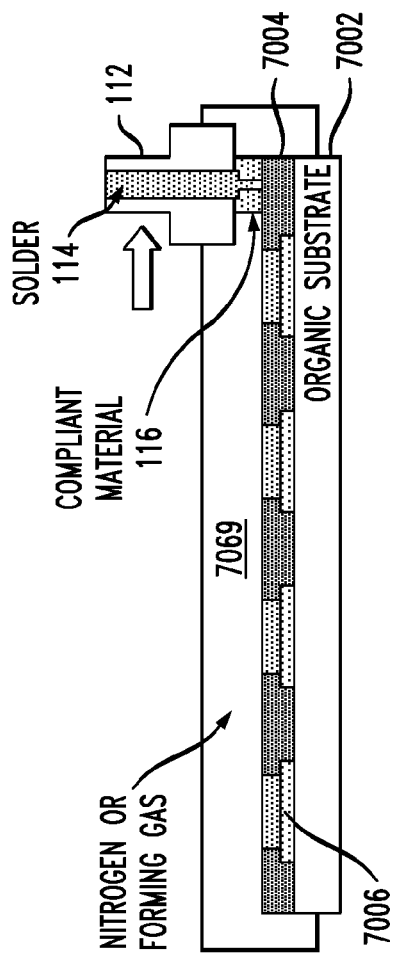
Figure 7C:
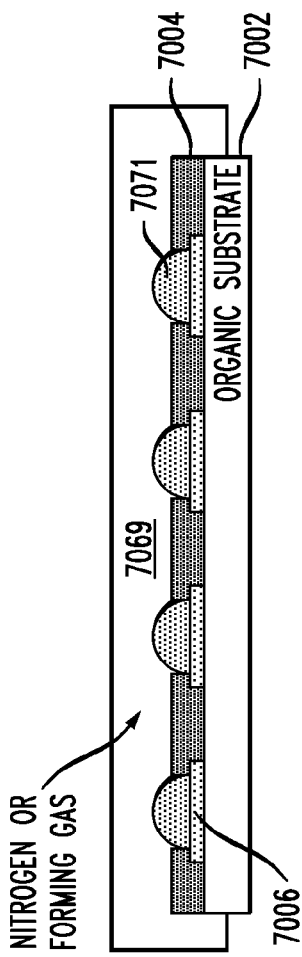

FIGS. 7A-7C are similar to FIGS. 4A-4C, except that they show a case where the process is carried out in a nitrogen environment 7069 in which the molten solder forms spheres ("balls-up") before solidification. Note substrate 7002, SR 7004, and generally straight-walled cylindrical openings in SR 7004 near pads 7006. Solder head 112 with compliant portion 116 delivering solder 114 can be implemented, for example, as described above. Instead of nitrogen a forming gas environment can be used. The forming gas is a mixture of Nitrogen ($N_2$) and Hydrogen ($H_2$); generally, 90% $N_2$ and 10% $H_2$. The nitrogen environment enables the solder to become generally spherical before solidification as at 7071 in FIG. 7C. This leads to a solidified solder bump that is higher than the solder resist surface without an additional solder reflow process. A wide SR opening can help to increase the height of the substrate solder bump.

Figure 8A:
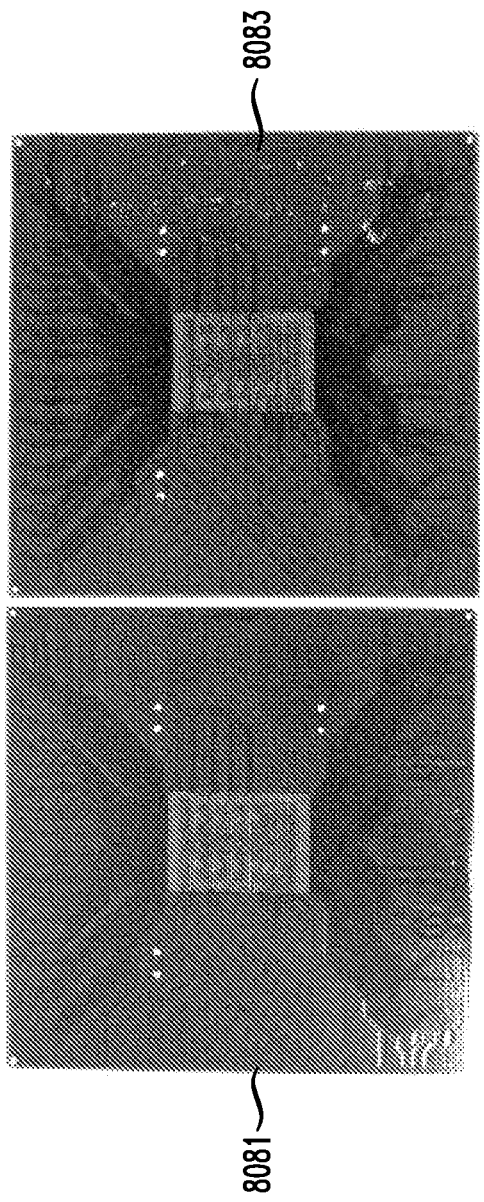
Figure 8B:
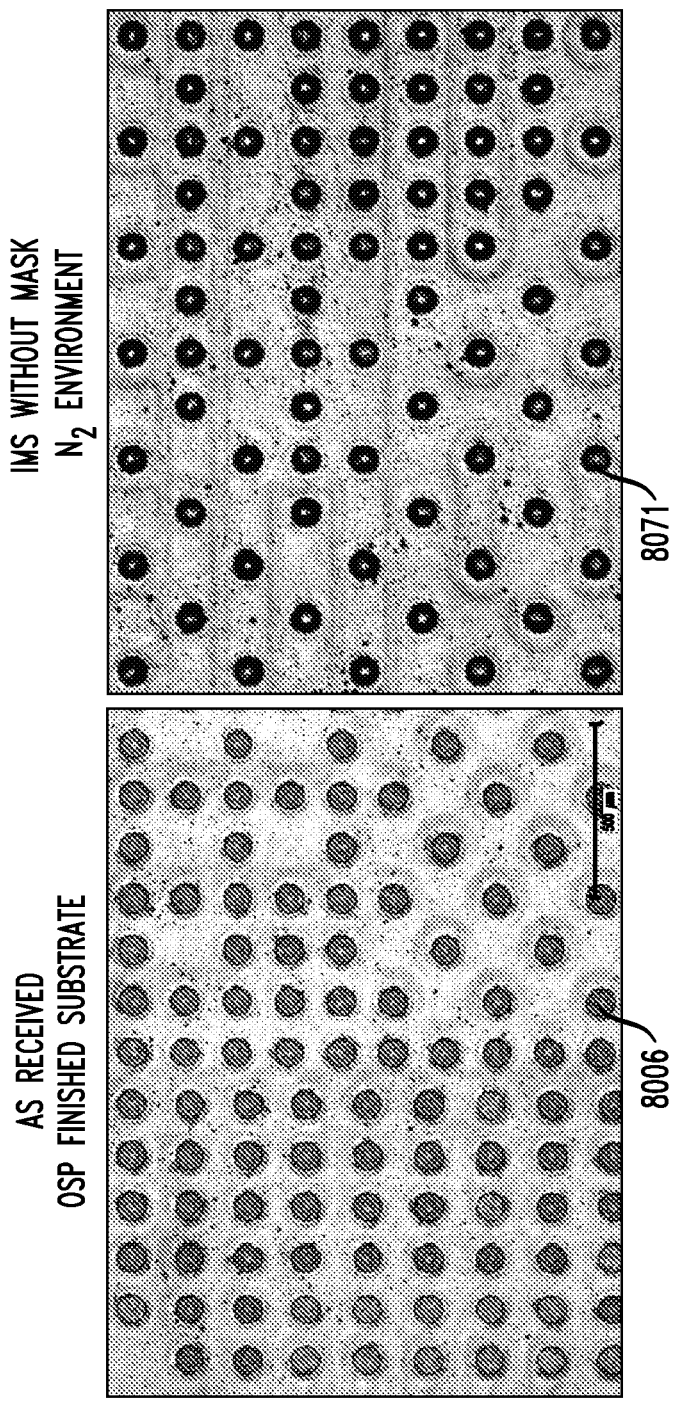
Figure 8C:
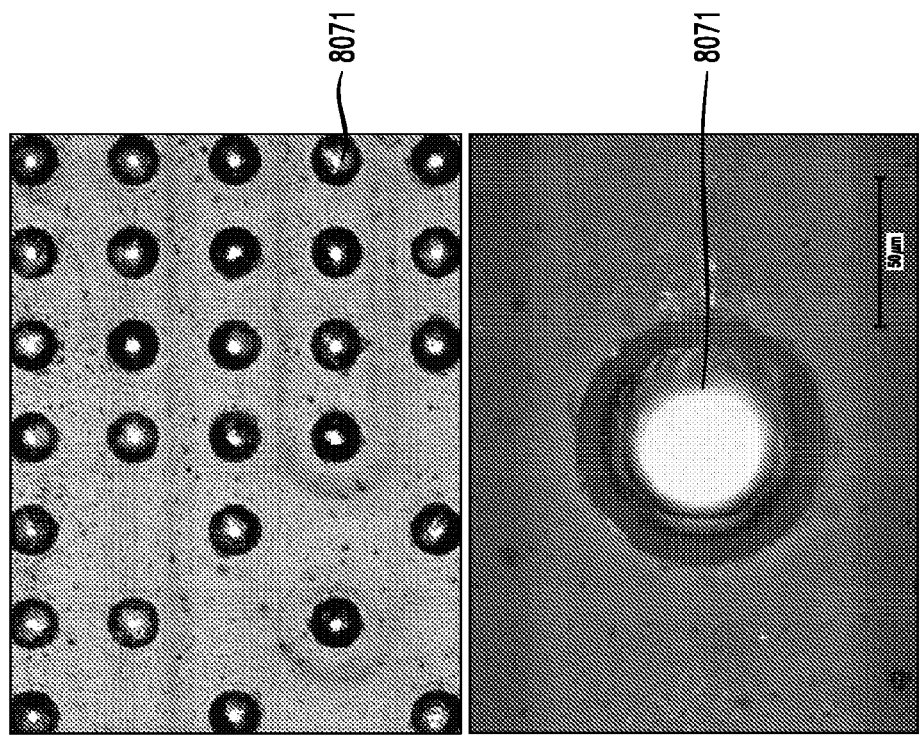
Figure 8C:
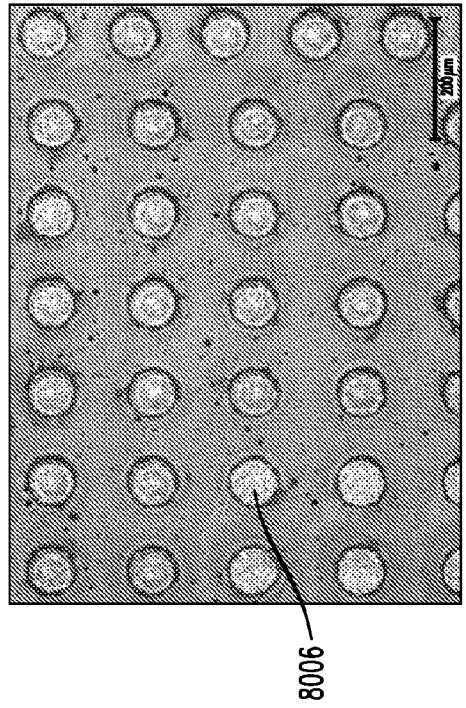
Figure 8D:
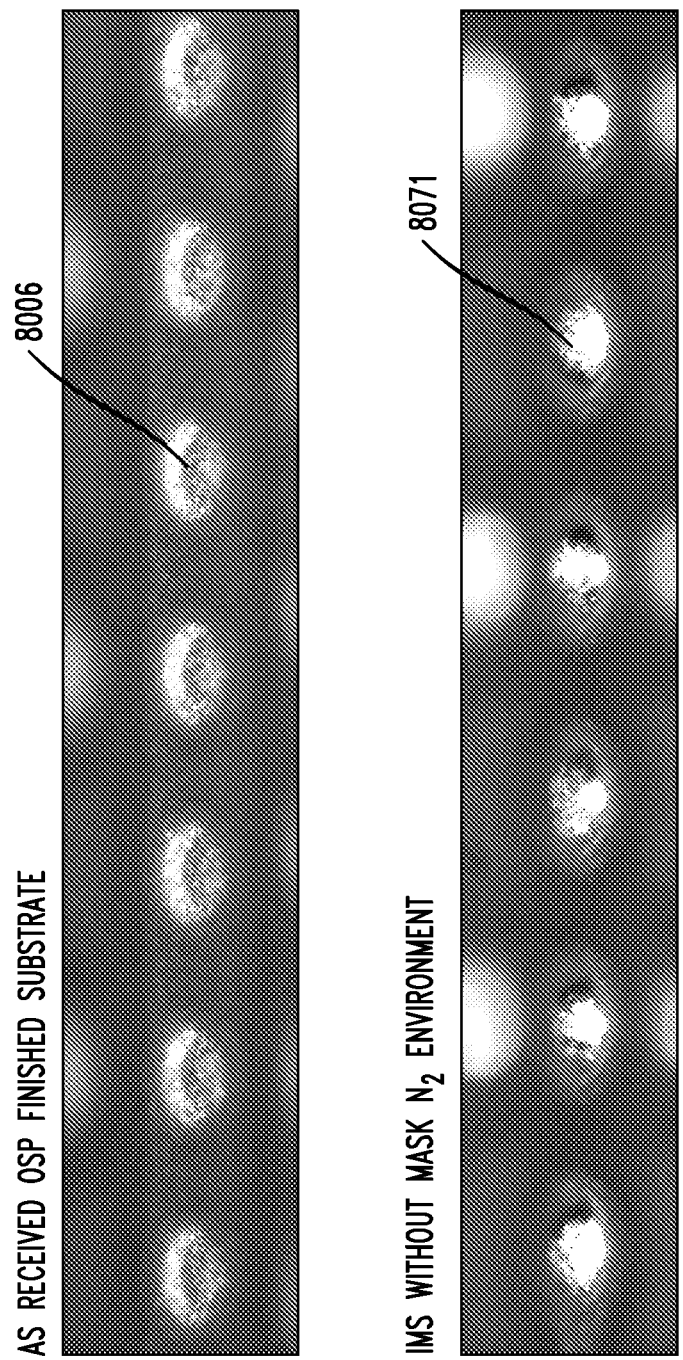

FIGS. 8A-8E present exemplary successful experimental verification of techniques as shown in FIGS. 7A-7C. The as-received OSP finished substrate 8081 shows the pads 8006 to be below the SR surface. "OSP" is Organic Solderability Preservative—OSP is coated on the top of copper pads. OSP provides oxidation resistance and corrosion resistance of copper pads before a solder bump is formed on the copper pads. The IMS bumped substrate 8083 shows the solder bumps 8071 to be above the SR surface. A 150 micron pitch was employed for experimental purposes. Note that FIG. 8D and FIG. 8E are the same picture, but FIG. 8D is 50 times magnification and FIG. 8E is 100 times magnification.

It should be noted that one or more embodiments of the invention intentionally form "wide-open" solder resist openings, as opposed to techniques where angled SR openings may occur naturally but unintentionally during a wet etching process.

In one aspect, a method of forming high volume solder bumps on a substrate includes carrying out an injection molded solder process without a mask, and providing a substrate having a plurality of wet-able metal pads in recessed regions. The substrate has solder resist openings above the pads that are wider than the metal pads.

In some cases, a substrate is obtained, having a plurality of wet-able pads in recessed regions and having wide-open solder resists defining volumes. Molten solder is directly injected into the volumes with the wet-able pads and the wide open solder resists, such that the volumes with the wet-able pads and the wide open solder resists are filled with solder. The solder is allowed to solidify, whereby the solder forms a plurality of solder structures adhered to the wet-able pads but not adhered to the wide open solder resists. The solidified solder is reflowed with flux or in a formic acid environment to "spheroid-ize" the solder on the wet-able pads.

In another aspect, a method of injection molded solder without a mask in a nitrogen (or forming gas) environment is provided, for forming solder bumps which have a greater height than the solder resist of the laminates.

In some cases, a substrate is obtained, having a plurality of wet-able pads in recessed regions defining volumes. Molten solder is directly injected into the volumes with the wet-able pads in the nitrogen environment, such that the volumes with the wet-able pads are filled with solder. The solder is allowed to solidify in the nitrogen environment, whereby the solder forms round top structures adhered to the wet-able pads. The solidified solder height is higher than the solder resist.

In one or more instances, a method for forming solder bumps on a substrate without a mask is provided. A substrate has wet-able pads in recessed regions and a wide open solder resist which defines volumes. Molten solder is directly injected into the volumes and filled with solder. The solder is allowed to solidify and adhered to the wettable pads but not adhered to the wide open solder resist. A following reflow process forms high volume solder bumps on the wettable pads. In addition, the molten solder injection process and the solidifying of solder in a nitrogen environment forms "spheroidized" solder bumps with a height greater than the solder resist without an additional reflow process.

One or more embodiments of the invention may employ almost any kind of solder, although very high melting temperature solder such as 97Pb3Sn may not be desirable for reasons as set forth below. Eutectic SnPb (37Pb63Sn) and Pb-free solder (pure Sn, SnAgCu, SnAg, SnCu, SnBi, SnIn, etc.) are non-limiting examples of suitable solders. The melting temperature of 97Pb3Sn is 320° C., so the organic substrate could be decomposed if using same, even though the time for molten solder injection is short. Any types of solders which have melting temperatures below 285° C. are believed to be particularly advantageous. When the solder is injected, the temperature of solder is above its melting temperature. Any type of substrates which has recessed pads may be employed. The oxygen concentration in the Nitrogen environment is preferably less than 10,000 ppm. The Nitrogen does not have to be perfectly pure and the forming gas does not have to have the exact composition as described elsewhere, as long as the basic functionality shown in FIGS. 7B and 7C can be obtained.

Given the discussion thus far, it will be appreciated that, in general terms, an exemplary method, according to an aspect of the invention, includes the step (see, e.g., FIGS. 4A, 5B, 5E, 5H, 5K, 6B, 6E) of obtaining an assembly comprising a substrate 4002, 6002; a plurality of wet-able pads 4006, 6006 formed on a surface of the substrate; and a solder resist layer 4004, 6051 deposited on the surface of the substrate and having an outer surface (upmost surface in the figures). At least the solder resist layer is formed with recessed regions defining volumes 4019, 5019, 5023, 5029, 5035, 6049 adjacent the wet-able pads. The method also includes (see, e.g., FIGS. 4B, 5C, 5F, 5I, 5L, 6C, 6F) directly injecting molten solder into the volumes adjacent the wet-able pads, such that the volumes adjacent the wet-able pads are filled with solder; and allowing the solder to solidify. The solder forms a plurality of solder structures (solder-filled volumes in FIGS. 4B, 5C, 5F, 5I, 5L, 6C, 6F where solder has solidified) adhered to the wet-able pads. With reference to FIGS. 4C, 5D, 5G, 5J, 5M, 6D, 6G, a further step includes re-heating the substrate and the solder after the solidification, to re-flow the solder into generally spherical balls 4016, extending above the outer surface of the solder resist layer. "Generally spherical" means spherical or sphere-like under the action of surface tension, with a possible flattened region adjacent the pad; the solder has a spherical shape due to its surface tension—one side which contacts the wetting pads (copper pad) has flattened shape but the other side which is free has spherical shape.

The volumes adjacent the wet-able pads are configured and dimensioned to receive sufficient solder in the injecting step such that the generally spherical balls extend above the outer surface of the solder resist layer as a result of the re-heating step.

As seen, for example, at 4021, in some cases, the solder balls extend above the outer surface of the solder resist layer by about 15 microns~about 45 microns. This range is appropriate for stencil printed solder bumps in a 150 micron pitch substrate. If the pitch of the substrate decreases, the required solder height above SR might be shorter. Therefore, in another aspect, the solder balls extend above the outer surface of the solder resist layer by about 5 microns~about 45 microns.

In some instances, the step of directly injecting the molten solder is carried out with an injection molded solder fill head 112, and the fill head comprises compliant material 116 interposed between the fill head and the solder resist layer to accommodate topographical features of the solder resist.

In at least some instances, the substrate comprises an organic substrate.

In one or more embodiments, the step of directly injecting the molten solder is carried out with an injection molded solder fill head 112, and an additional step includes causing relative motion between (i) the head and (ii) the substrate, during the injecting.

In some instances, in the step of obtaining the assembly, the substrate is a solder-mask-defined substrate.

As seen in FIGS. 4A-4F and 5B-5D, in some cases, in the step of obtaining the assembly, the volumes 4019, 5019 adjacent the wet-able pads 4019, 5019 are at least partially frustoconical (e.g., frustoconical, or part is frustoconical and part is cylindrical), having smaller diameters adjacent the pads and larger diameters opposite the pads.

As seen in FIGS. 5E-5G, in some cases, in the step of obtaining the assembly, the volumes 5023 adjacent the wet-able pads have a stepped cylindrical configuration, having a smaller diameter cylinder 5025 adjacent the pads and a larger diameter cylinder 5027 opposite the pads.

As seen in FIGS. 5H-5M, in some cases, in the step of obtaining the assembly, the volumes 5029, 5035 adjacent the wet-able pads have a central cylindrical portion 5033, 5039 adjacent the pads and at least one peripheral reservoir portion 5031, 5037 in fluid communication with the central cylindrical portion.

As in FIGS. 5K-5M, in some cases, in the step of obtaining the assembly, the volumes adjacent the wet-able pads have at least four of the peripheral reservoir portions 5037 in fluid communication with the central cylindrical portion 5039.

In some instances, in the step of obtaining the assembly, the substrate is a non-solder-mask-defined substrate.

In some cases, such as in FIGS. 6B-6G, in the step of obtaining the assembly, the substrate 6002 is also formed with recessed regions 6055, 6057, and the recessed regions of the substrate cooperatively define the volumes 6049 together with the recessed regions of the solder resist layer 6051.

As shown in the example of FIGS. 6B-6G, in some cases, in the step of obtaining the assembly, the recessed regions 6055, 6057 of the substrate comprise trenches extending at least partially about the pads (partial in FIGS. 6E-6G, completely surrounding in FIGS. 6B-6D).

Furthermore, given the discussion thus far, it will be appreciated that, in general terms, another exemplary method, according to another aspect of the invention, includes the step (see FIG. 7A) of obtaining an assembly comprising a substrate 7002; a plurality of wet-able pads 7006 formed on a surface of the substrate; and a solder resist layer 7004 deposited on the surface of the substrate and having an outer surface. At least the solder resist layer is formed with recessed regions (not separately numbered—voides over pads 7006) defining volumes adjacent the wet-able pads. An additional step (see FIG. 7B) includes directly injecting molten solder 114 into the volumes adjacent the wet-able pads, such that the volumes adjacent the wet-able pads are filled with solder. The injecting is carried out in one of a nitrogen environment and a forming gas environment, as per 7069. An additional step includes allowing the solder to solidify, whereby the solder forms a plurality of at least partially spherical solder structures 7071 adhered to the wet-able pads. The solidification is carried out in the aforementioned nitrogen or forming gas environment, as seen in FIG. 7C. The volumes adjacent the wet-able pads are configured and dimensioned to receive sufficient solder in the injecting step such that the generally spherical solder structures 7071 extend above the outer surface of the solder resist layer as a result of the solidification step.

In some instances, as a result of the solidification step, the solder balls 7071 extend above the outer surface of the solder resist layer by about 15 microns~about 45 microns. This range is appropriate for stencil printed solder bumps in a 150 micron pitch substrate. If the pitch of the substrate decreases, the required solder height above SR might be shorter. Therefore, in another aspect, the solder balls extend above the outer surface of the solder resist layer by about 5 microns~about 45 microns.

The step of directly injecting the molten solder 114 can be carried out with an injection molded solder fill head 112. The fill head can include compliant material 116 interposed between the fill head and the solder resist layer to accommodate topographical features of the solder resist 7004.

In at least some instances, the substrate is an organic substrate.

In one or more embodiments, the step of directly injecting the molten solder is carried out with an injection molded solder fill head 112, and an additional step includes causing relative motion between (i) the head and (ii) the substrate, during the injecting.

The methods described above can be used in the fabrication and packaging of integrated circuit chips; in particular, techniques set forth herein can be used to make arrays of solder balls for attachment to an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GD-SII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end or consumer electronic applications to advanced computer products, having a display, a keyboard or other input device, and a central processor. The techniques set for the herein can be used for interconnecting the chip on chips or chip stacks for 3D applications, chips on wafers, chips on package or package on package.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising the steps of:
    obtaining an assembly comprising:
        a substrate;
        a plurality of wet-able pads formed on a surface of said substrate; and
        a solder resist layer deposited on said surface of said substrate and having an outer surface, wherein at least said solder resist layer is formed with recessed regions defining volumes adjacent said wet-able pads, wherein a recessed region includes a straight region extending perpendicularly with respect to a top surface of an adjacent wet-able pad, and an inclined region extending from the straight region at an oblique angle with respect to the straight region;
    directly injecting molten solder into said volumes adjacent said wet-able pads, such that said volumes adjacent said wet-able pads are filled with solder;
    allowing said solder to solidify, whereby said solder forms a plurality of solder structures adhered to said wet-able pads; and
    re-heating said substrate and said solder after said solidification, to re-flow said solder into generally spherical balls extending above said outer surface of said solder resist layer;
    wherein said volumes adjacent said wet-able pads are configured and dimensioned to receive sufficient solder in said injecting step such that said generally spherical balls extend above said outer surface of said solder resist layer as a result of said re-heating step.

2. The method of claim 1, wherein, as a result of said re-heating step, said solder balls extend above said outer surface of said solder resist layer by about 5 microns to about 45 microns.

3. The method of claim 1, wherein said step of directly injecting said molten solder is carried out with an injection molded solder fill head, and wherein said fill head comprises compliant material interposed between said fill head and said solder resist layer to accommodate topographical features of said solder resist.

4. The method of claim 1, wherein, in said step of obtaining said assembly, said substrate comprises an organic substrate.

5. The method of claim 1, wherein said step of directly injecting said molten solder is carried out with an injection molded solder fill head, further comprising causing relative motion between (i) said head and (ii) said substrate, during said injecting.

6. The method of claim 1, wherein, in said step of obtaining said assembly, said substrate comprises a solder-mask-defined substrate.

7. The method of claim 6, wherein, in said step of obtaining said assembly, said volumes adjacent said wet-able pads are at least partially frustoconical, having smaller diameters adjacent said pads and larger diameters opposite said pads.

8. The method of claim 1, wherein the straight region extends in a direction with increasing distance from the substrate.

9. The method of claim 1, wherein the straight region extends parallel to a height of the adjacent wet-able pad, and the height is a distance from a top surface of the substrate to the top surface of the adjacent wet-able pad.

* * * * *